Figure 1:
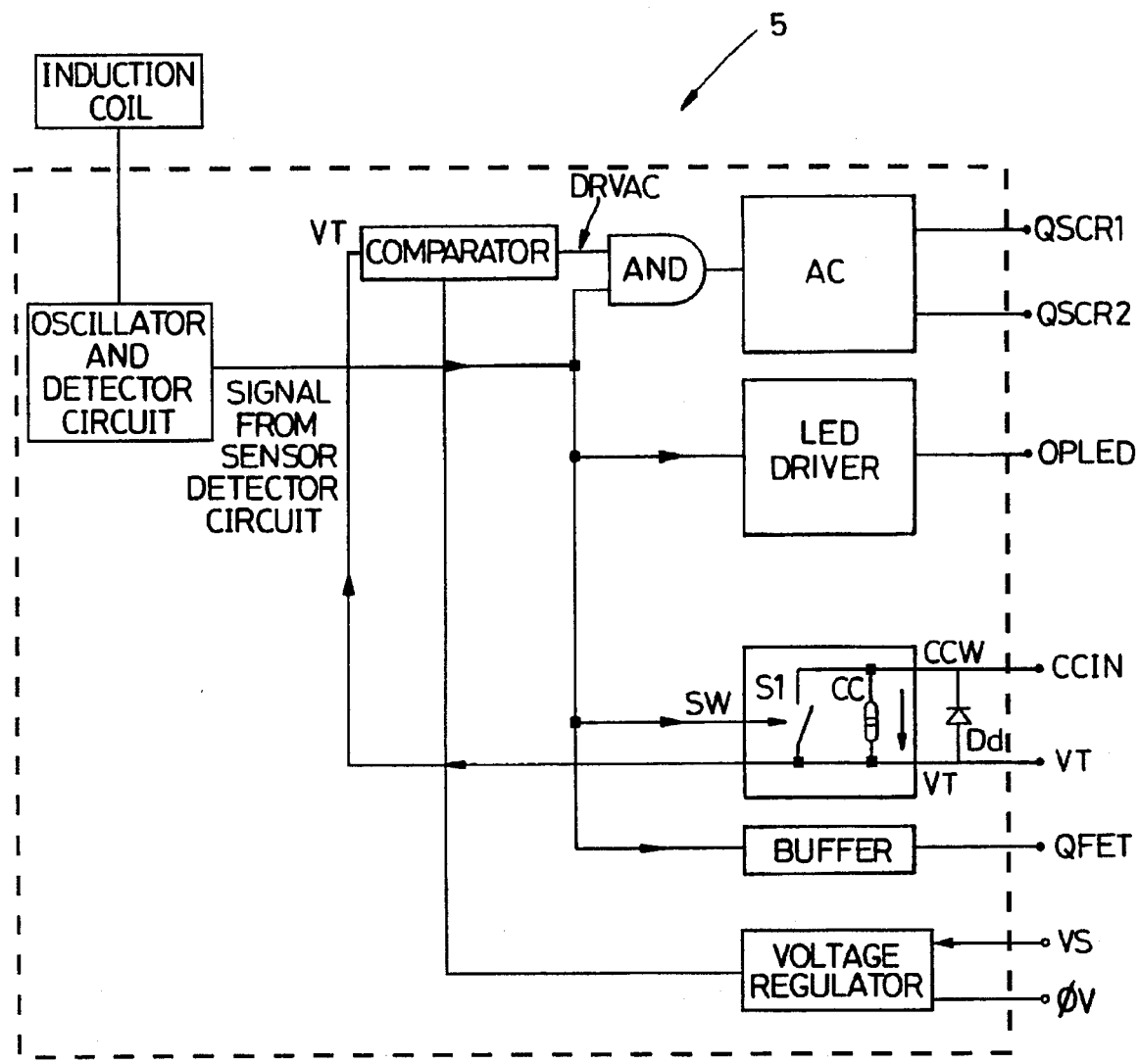

United States Patent [19]

Calder et al.

[11] Patent Number: 5,552,644
[45] Date of Patent: Sep. 3, 1996

[54] PROXIMITY SWITCHES

[76] Inventors: Douglas W. Calder, 8 Ochiltree Court, Dunblane, Pertshire FK15 0DG, Scotland, United Kingdom; Arthur J. Bizley, 43 Saffron Close, Wootton Bassett, Swindon, Wiltshire, England, SN4 7JB

[21] Appl. No.: 244,826

[22] PCT Filed: Dec. 28, 1992

[86] PCT No.: PCT/US92/11232

§ 371 Date: Jan. 24, 1995

§ 102(e) Date: Jan. 24, 1995

[30] Foreign Application Priority Data

Dec. 31, 1991 [GB] United Kingdom ............... 9127571

[51] Int. Cl.$^6$ ................................................ H01H 35/00
[52] U.S. Cl. ................ 307/116; 327/432; 323/234; 323/235; 324/207.14; 324/207.22; 422/62; 340/620
[58] Field of Search ................ 307/116; 323/324, 323/234, 235, 234, 245; 327/432; 324/207.14, 207.22; 340/620; 422/62

[56] References Cited

U.S. PATENT DOCUMENTS

| 4,757,341 | 7/1988 | Tanigawa | 307/648 |
| 4,803,418 | 2/1989 | Ritchie | 323/324 |
| 4,924,122 | 5/1990 | Harris | 307/570 |

Primary Examiner—William M. Shoop, Jr.
Assistant Examiner—Albert W. Paladini
Attorney, Agent, or Firm—Larry I. Golden; Michael J. Femal; Larry T. Shrout

[57] ABSTRACT

There is disclosed a two wire AC power supply for proximity switch integrated circuits. A problem has existed with previous power supplies in that such have been implemented using discrete devices, which take up valuable room on any printed wiring assembly. This invention therefore provides a two wire AC power supply for a proximity switch integrated circuit, wherein at least some circuitry associated with the power supply is provided within the integrated circuit. The power supply preferably comprises a bridge rectifier (BR1), a voltage regulator (Z1, R1, M1), a thyristor (SCR), a diode (D1), a storage capacitor (CVS), a comparator, and an AND gate, wherein at least the comparator and the AND gate are provided within the integrated circuit.

8 Claims, 7 Drawing Sheets

PROXIMITY SWITCHES

This invention relates to proximity switches or sensors, and in particular to a two wire AC power supply for proximity switch integrated circuits.

Accordingly, one aspect of the present invention provides a two wire AC power supply for a proximity switch integrated circuit, wherein at least some circuitry associated with the power supply is provided within the integrated circuit.

Preferably the two wire AC power supply comprises a bridge rectifier, an output of which i connected in parallel across a voltage regulator and also in parallel across a thyristor, an output of the regulator being connected in parallel to a diode connected in series to a storage capacitor, the cathode of the diode being connected to the storage capacitor, the output of the regulator further being connected to one input of a comparator, another input of the comparator being held at a constant reference voltage, an output of the comparator being connected to a first input of an AND gate, a second input of the AND gate being connected to an output from the proximity switch indicative of the switch state, an output of the AND gate being connected to a gate of the thyristor, and wherein further, the comparator and the AND gate are provided within the integrated circuit.

A current limiting circuit connected in parallel with a switch may be provided between the output of the voltage regulator and the anode of the diode, the current limiting circuit and the switch also being provided within the integrated circuit.

The integrated circuit may be implemented in bipolar transistor technology, or in any other suitable transistor technology.

Preferably, the comparator comprises a PNP differential pair Q1, Q2 powered via a further current source Q7, Q8, the first input of the comparator being connected to means for dividing down the input voltage QD1, R1, R2 and QD2, the divided down voltage being applied to the base of the transistor Q1 the second input being connected to further means for dividing down a regulated voltage V3V5 and for providing hysteresis R3, R4, R5, Q5, Q6 the regulated voltage being derived from the integrated circuit, the collectors of the differential pair Q1, Q2 being connected to a differential to single-ended converter Q3, Q4 an output from the comparator being developed at the collector of a further transistor Q6, the collector of which is connected to a current source Q9, and the base of which is connected to the further dividing down means.

Preferably, the constant current circuit comprises two NPN transistors QCC1, QCC2 connected in parallel, and further connected between their collectors and bases in parallel with a resistor R100UA, the emitters being connected to a parallel arrangement comprising a resistor R2500UA connected in parallel between the base to emitter junction of a further NPN transistor Q2500UA which is connected in series with a resistor RTHUR1, the collector of the further transistor Q2500UA being connected to the bases of the two NPN transistors QCC1 and QCC2.

Preferably, the switch connected in parallel with the constant current circuit comprises a resistor RSAT connected to the collector of a transistor QDARL having a resistor RODARL connected between its base and emitter, the emitter of the transistor QDARL being connected to the base of a transistor QSW, the transistor QSW having a resistor RQSW connected between its base and emitter, the emitter of transistor QSW further being connected to a parallel arrangement comprising a resistor R50MA and the base to emitter junction of another transistor Q50MA which is connected in series with a resistor RTHUR2, the collector of the other transistor Q50MA further being connected to the base of the transistor QDARL.

Preferably the base current to transistor QDARL is provided by a current mirror QM4, QM5, QM6, QM7, QM8, input current to the mirror being controlled by a signal derived from the proximity switch.

According to a second aspect of the present invention there is provided an integrated circuit for use in a two wire AC power supply for a proximity switch.

Preferably, the integrated circuit of the power supply is integrated with that of the proximity switch.

Figure 2:
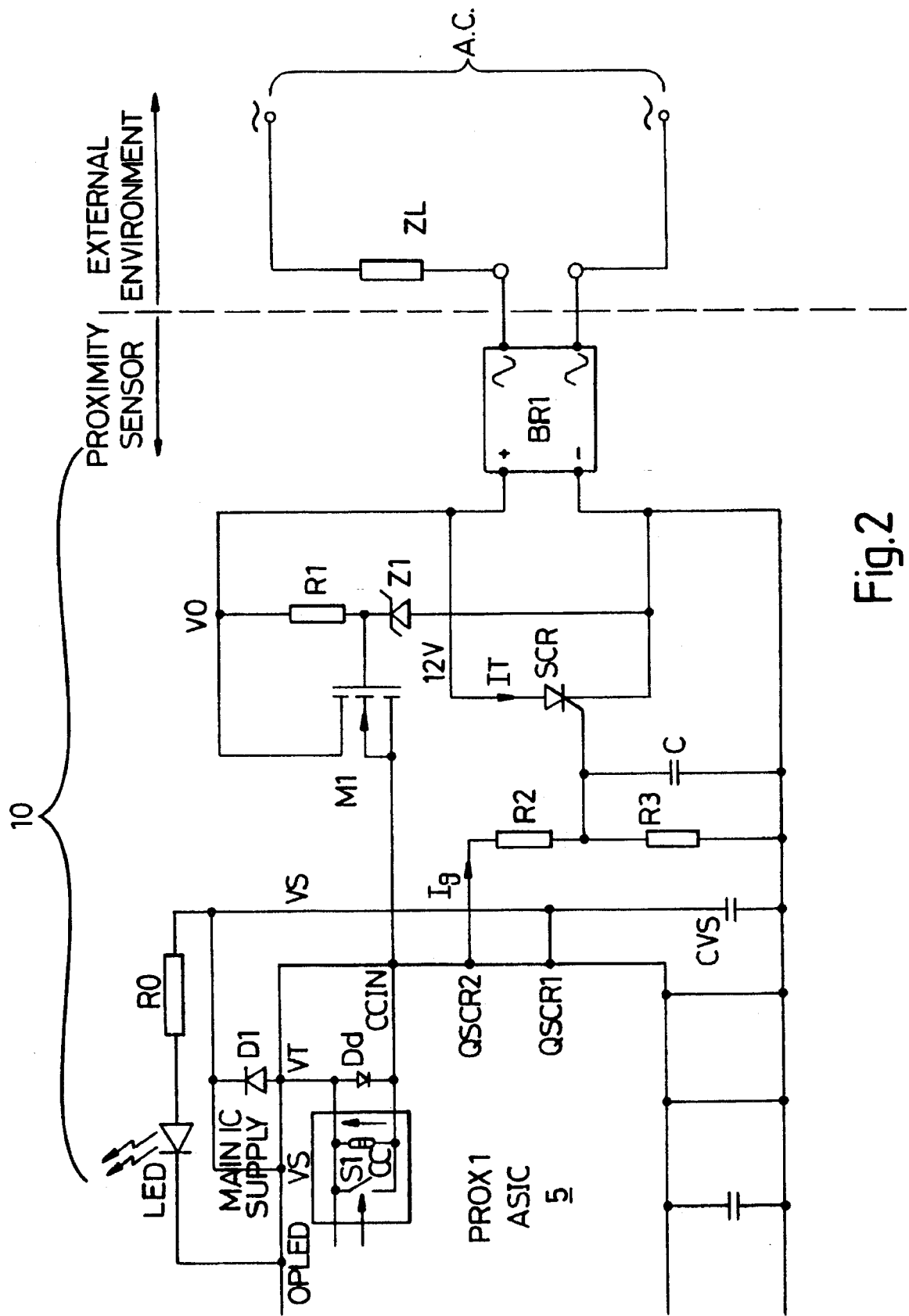
Figure 4A:
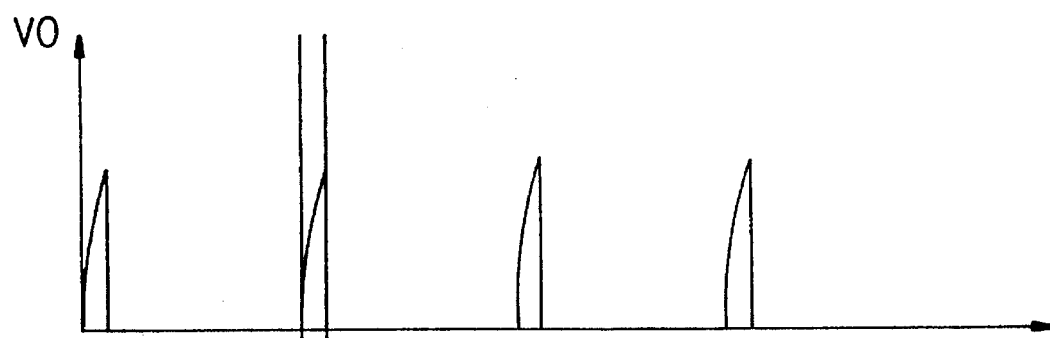
Figure 4B:
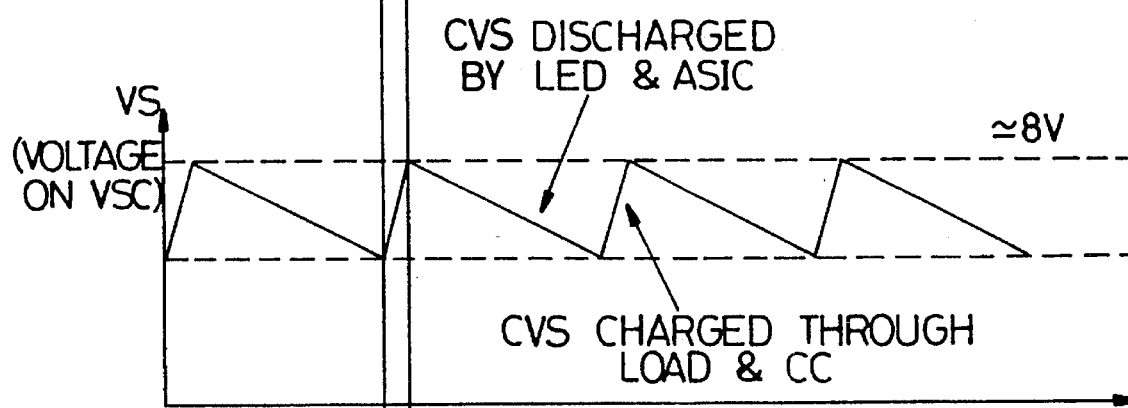
Figure 4C:
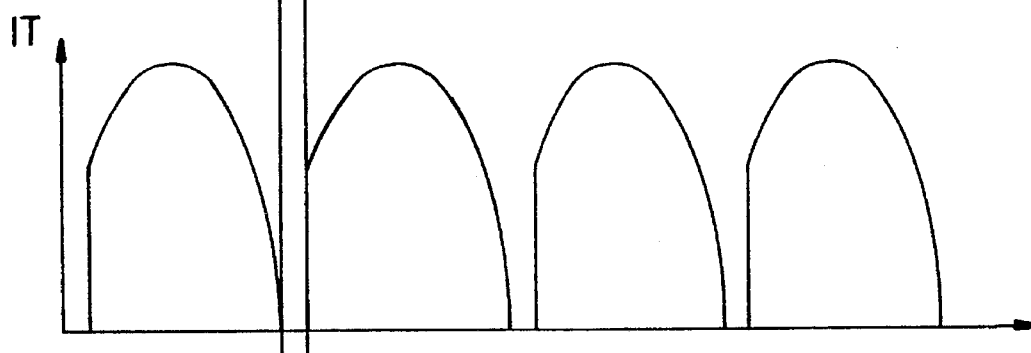
Figure 5A:
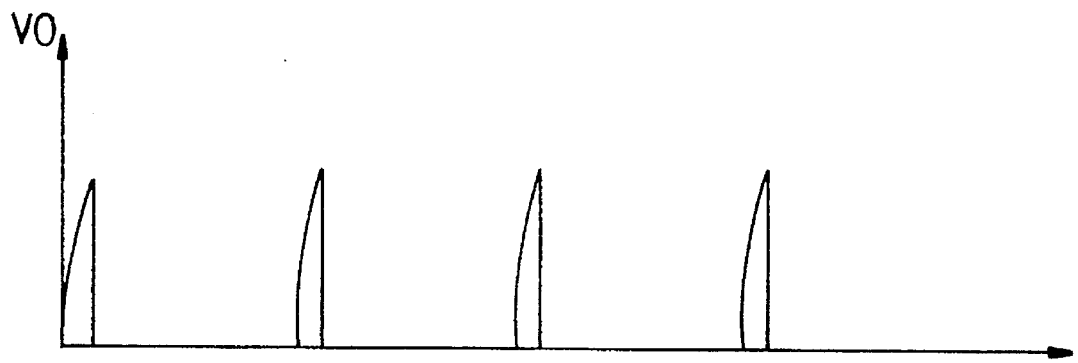
Figure 5B:
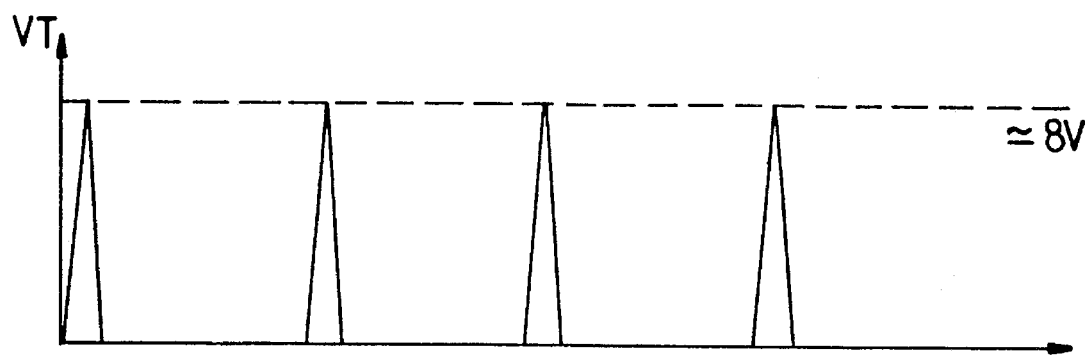
Figure 5C:
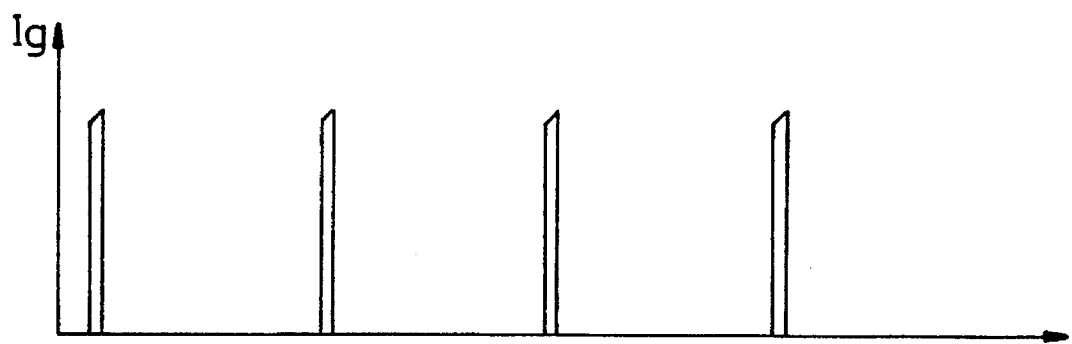
Figure 6:
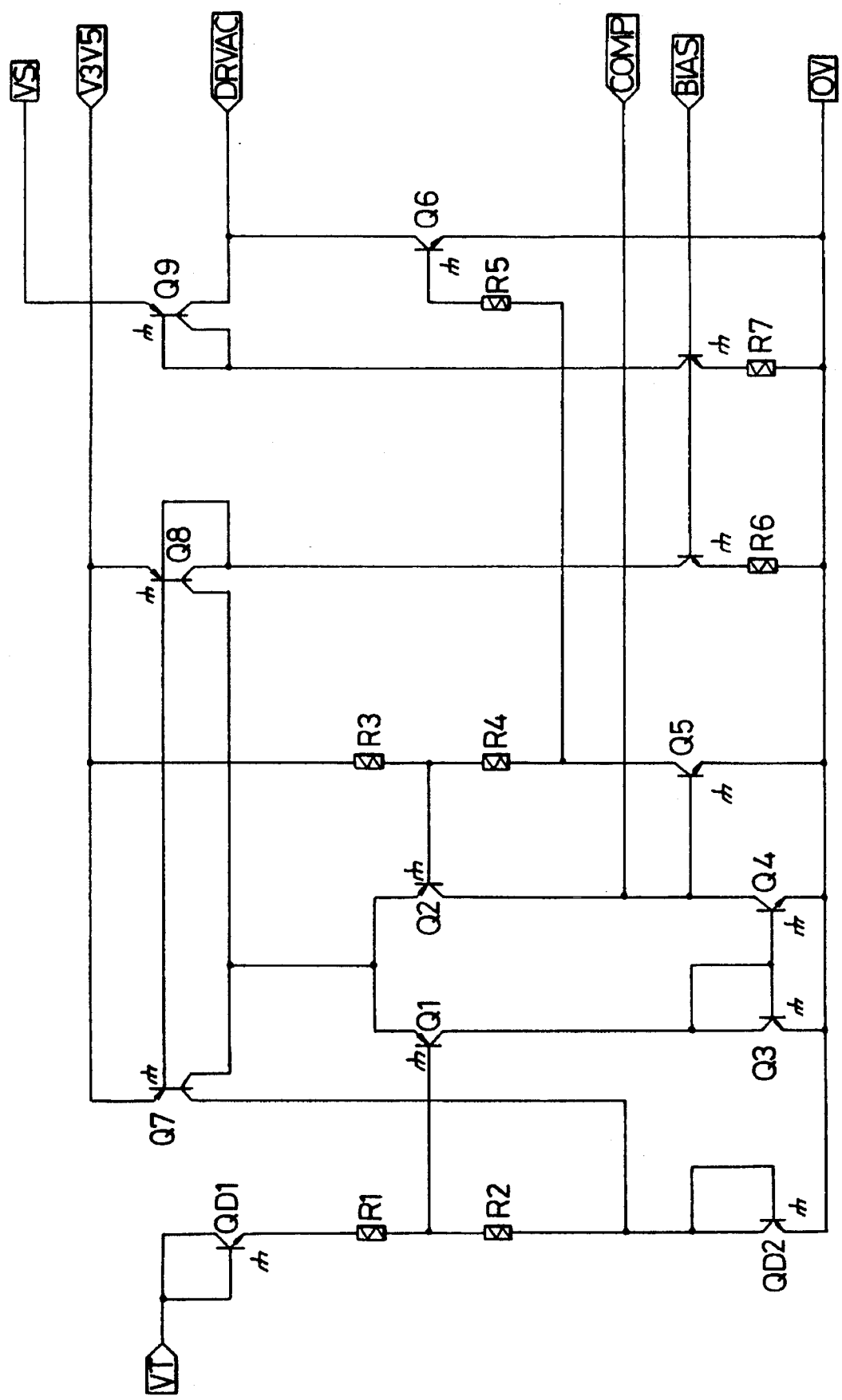
Figure 7:
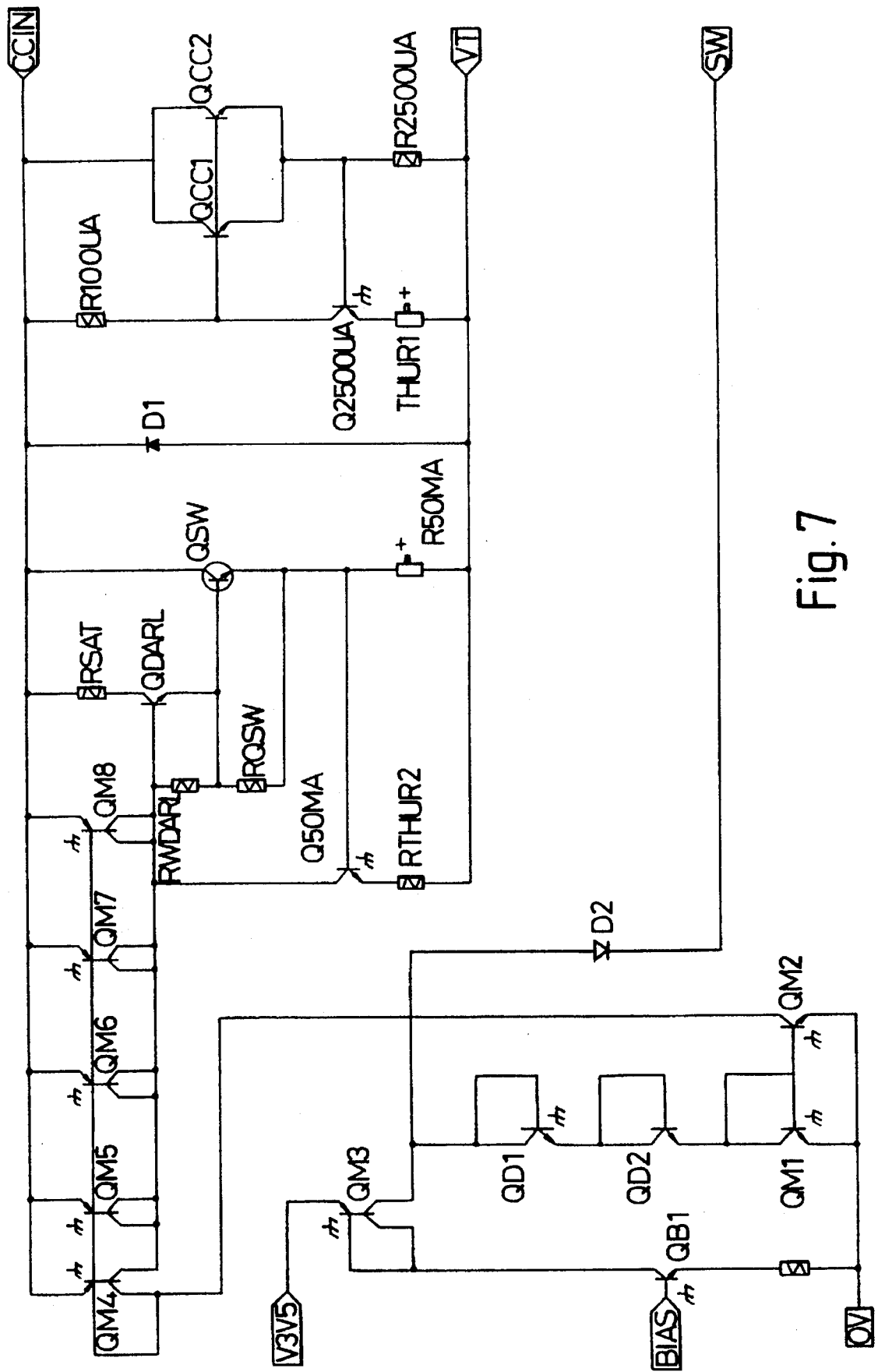

An embodiment of the invention will now be described, by way of example only, with reference to the accompanying drawings which are:

FIG. 1 a block schematic diagram of an embodiment of an integrated circuit for use in a power supply for a proximity switch according to the present invention;

FIG. 2 a schematic circuit diagram of a power supply using the integrated circuit of FIG. 1;

FIG. 3 (a), (b), (c) various signal timing diagrams relating to the power supply of FIG. 2 when the proximity switch is in an open state;

FIG. 4 (a), (b), (c) various signal timing diagrams relating to the power supply of FIG. 2 when the proximity switch is in a closed state;

FIG. 5 (a), (b), (c) additional signal timing diagrams relating to the power supply of FIG. 2 when the proximity switch is in a closed state;

FIG. 6 a schematic circuit diagram of a comparator for use in the integrated circuit of FIG. 1; and FIG. 7 a schematic circuit diagram of a constant current switch circuit for use in the integrated circuit of FIG. 1.

Referring to FIG. 1 there is shown a block schematic diagram of an embodiment of an integrated circuit (IC), generally designated 5, for use in a proximity switch of the type having an induction coil driven by an oscillator and a detector circuit for producing an output signal in response to a change in oscillation when an object is proximate the induction coil such as described in Harris, U.S. Pat. Nos. 4,456,834 and 4,924,122. The integrated circuit 5 also includes a comparator block and a constant current/switch block which are portions of the power supply according to the present invention. The comparator and constant current circuit blocks will be illustrated in greater detail in FIGS. 6 and 7 respectively.

The external environment of the IC 5 is shown in FIG. 2 which shows a schematic circuit diagram of a power supply using the IC 5 within a sensor (ie proximity switch) 10 indicated to the left of the dashed vertical line. FIG. 2 further shows how the sensor 10 is serially connected to a load ZL (i.e. a light, relay, PLC etc.) across an AC power supply as indicated to the right of the dashed vertical line.

Referring to FIG. 2 the power supply comprises a full wave bridge rectifier BR1, the output of which is connected across a conventional voltage regulator comprising a resistor R1, n-channel MOSFET M1 and zener diode Z1. The regulated voltage, which may for example be 12 V, is supplied to the IC 5 via a pin CCIN.

The pin CCIN is connected, internally of the IC 5 to a current limiting circuit comprising a current source CC connected in parallel with a switch S1, this parallel arrangement further being connected in parallel with a reverse biassed diode Dd. The other end of this parallel arrangement is connected internally of the IC 5 to an external pin VT of the IC 5.

Connected to pin VT externally of the IC 5 is the anode of a diode D1, the cathode of the diode D1 being connected to an external pin Vs of the IC 5 from whence the main IC supply voltage Vs may be derived, the cathode of the diode D1 further being connected to one end of a storage capacitor CVS, the other end of the storage capacitor CVS being connected to the negative terminal of the bridge rectifier (BR1). The storage capacitor CVS may be of a value of around 10 μF.

The cathode of the diode is further connected to one end of a resistor Ro the other end being connected to an anode of an LED, the cathode of the LED being connected to an external pin OPLED of the IC 5.

An external pin QSCR1 of the IC 5 is connected between the cathode of the diode D1 and the storage capacitor CVS. An external pin QSCR2 is further connected externally of the IC 5 to resistors R2 and R3 in series. Resistor R3 is connected in parallel with a capacitor C, the gate of a thyristor or silicon controlled rectifier SCR further being connected between resistors R2 and R3. The SCR itself is connected in parallel across the output from the bridge rectifier BR1.

Figure 3A:
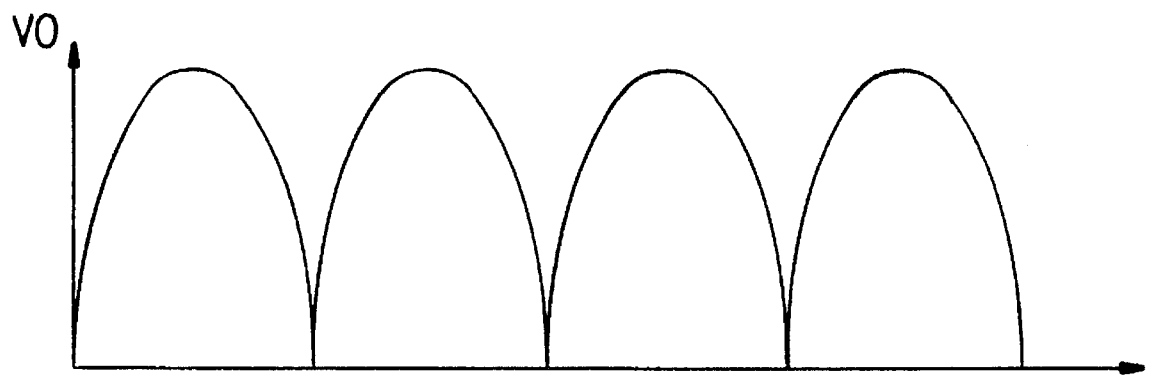

In the OFF state of the proximity switch/sensor, the bridge BR1 provides full wave rectification of the AC supply. The full wave rectified signal is as shown in FIG. 3(a). The rectified voltage developed is regulated to a suitable level for the IC 5 by the regulator comprising components Z1, R1 and M1, the regulated voltage Vs being supplied to the IC 5 via pin CCIN.

In this state the logical operation of the circuitry is such than QSCR1 and QSCR2 are inactive and the SCR is not triggered. Therefore, the only leakage current drawn from the supply is that which is required to bias the regulator and supply the internal circuits of the IC 5.

The current flowing into pin CCIN flows through the current limiting circuit CC and the external diode Di to VS. VS is the main supply rail of the IC 5. The purpose of the current limiting circuit CC is to limit the current flow into the storage capacitor CVS at power up when the capacitor CVS is in a discharged state. Without this protection, the switch on current transient drawn from the supply through load ZL would be sufficient to activate the load IL electrically thereby falsely indicating a detected target.

Figure 3B:
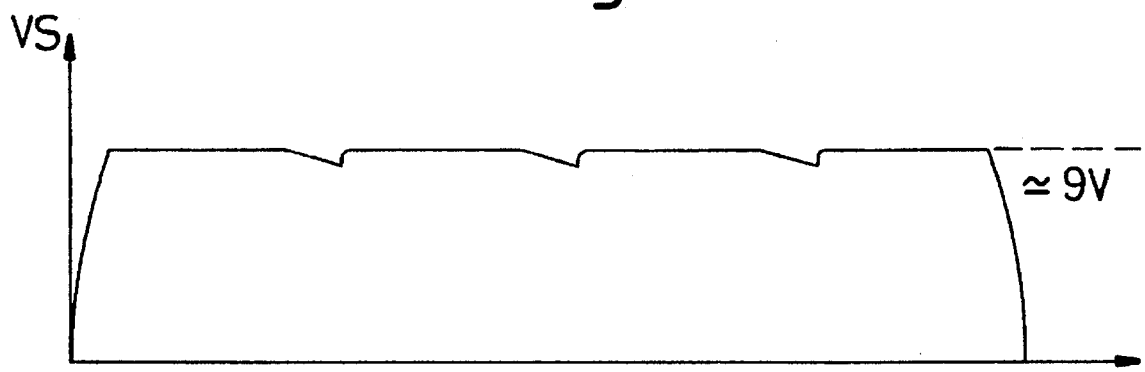
Figure 3C:
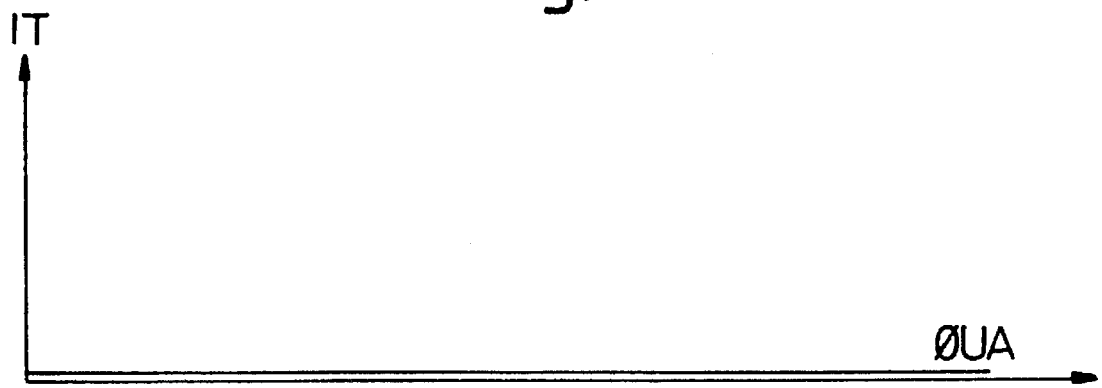

Since in the OFF state, the SCR is not active at any time during the AC cycle, the rectified and smoothed voltage Vs is maintained at a satisfactory level indefinitely, as can be seen from FIG. 3(b). As can be seen from FIG. 3(c), current It through the SCR is effectively zero in this state.

In the ON state, ie when the target is in such a position to energise the output signal from the detector circuit of a proximity sensor, the current limiting circuit CC is by-passed by the switch S1. This allows storage capacitor CVS to charge at a rate which is fixed primarily by the value of the load impedance ZL.

The operation of the circuitry can in this instance be described with reference to FIGS. 4 and 5. At a zero current/zero voltage cross-over point of the rectified AC waveform, the SCR is off. As the voltage Vo builds up, the reservoir capacitor CVS begins to charge up. When the charge stored on the capacitor CVS has built up to a sufficient level, for example 8 volts, sufficient to independently power the integrated circuit and LEDs for the rest of the AC half-cycle, an internal comparator circuit energises the gate of the SCR. Thus, the low SCR anode to cathode impedance makes the two outputs of the sensor a low impedance circuit to the AC power supply. As can be seen from FIG. 1, the output of the comparator is ANDed via an AND gate with the signal from the front end of the sensor. In this way, the thyristor SCR is only activated if the voltage VT has reached a sufficient level and the signal from the front end of the proximity sensor 10 indicates that a target has been detected.

When the gate of the SCR is activated, and the power supply becomes low impedance, the voltage Vo collapses to almost zero, and the storage capacitor CVS is relied upon to power the IC 5 and LEDs till the next zero current cross-over point when the SCR extinguishes.

After the next cross-over point the cycle described above repeats itself. It should, of course, be noted, as can be seen from FIG. 4(b) that the supply voltage Vs must at all times stay above the minimum operating level for the IC 5 which is approximately 4.5 volts in this case.

The rest of the timing diagrams, as shown in FIGS. 4 and 5, are apparent in view of the foregoing description, and shall not be described in any more detail herein.

FIG. 6 shows the detail of the comparator circuit used in the present embodiment. As can be seen from FIG. 6, the comparator circuit comprises a PNP differential pair of transistors Q1 and Q2 powered from a current source comprising transistors Q7 and Q8. The input signal VT to one input of the comparator inputs is divided down by a combination of a transistor QD1, resistor R1, resistor R2 and transistor QD2. The reference voltage (V3V5) input to the other input of the comparator is provided by the combination of resistors R3, R4 and R5 and transistors Q5 and Q6. Transistors Q3 and Q4 form a differential to single-ended converter, and the comparator output DRVAC is developed at the collector of transistor Q6 using a current source comprising a transistor Q9.

In this embodiment, a signal labelled BIAS is the reference voltage provided by a simple IC network of the IC 5, while VS and V3V5, as indicated in FIG. 6, are the unstablised and regulated supply rails respectively.

FIG. 7 shows the detailed implementation of a constant current and switch circuit. The constant current circuit comprises transistors QCC1, QCC2, Q2500UA and resistors R2500UA and RTHUR1 and R100UA provided between external pins CCIN and VT of the IC 5.

In parallel with the constant current circuit is a switch ie. a switchable high-current path, comprising transistors QDARL, QSW, Q50MA and resistors RSAT, RQDARL, RQSW, R50MA and RTHUR2, this arrangement being internally current limited to approximately 55 mA to prevent excess dissipation. This second, low impedance path from CCIN to VT can be turned ON or OFF by controlling the base current to QDARL which is provided by a current mirror comprising transistors QM4, QM5, QM6, QM7, QM8. The input current to the current mirror is in turn controlled by a signal from the sensor front end via transistors QM1, QM2, QM3, QB1, QD1, QD2 and diode D2. Note that the signals V3V5 and BIAS have the same meaning as in the comparator circuit, shown in FIG. 6, while CCIN is the regulated supply rail.

The remaining blocks shown in FIG. 1, ie. buffer, LED driver and AC are all simple Darlington driver arrangements, as known in the art. These shall, therefore, not be discussed in any more detail herein.

It should be appreciated that the electronic circuitry associated with a proximity switch operating in two wire AC applications has until now been implemented using discrete devices, which take up valuable room on the printed wiring assembly. This has placed a limit on the smallest size of product in which a two wire AC function can be included. This problem can be obviated or mitigated by use of the present invention. The invention provides this by incorporating into the application specific integrated circuit (ASIC) associated with the proximity switch some or all of the circuitry associated with the power supply, for example the comparator circuitry and ANDing circuitry, as well as the constant current circuitry and switch.

An embodiment of the invention has hereinbefore been described. It should, however, be appreciated that the embodiment disclosed is in no way meant to limit the scope of the invention, and that other embodiments and variations on the disclosed embodiment may be envisaged.

Finally, it should be appreciated that an important advantage of the present invention is that it enables smaller size and lower cost two wires AC power supplies for proximity switch ICs to be produced, and further enables a two wire AC proximity sensor circuit to be built into a smaller diameter tube than has previously been the case.

We claim:

1. A two wire AC power supply for a proximity switch integrated circuit comprising:
   a bridge rectifier connected to an external AC power source;
   a voltage regulator, connected in parallel with the bridge rectifier;
   a thyristor, also connected in parallel with the bridge rectifier;
   a diode having its anode connected to an output of the regulator;
   a storage capacitor being connected between the cathode of the diode and an output of the bridge rectifier;
   a comparator, having one input connected to the other output of said regulator and another input being held at a constant reference voltage; and
   an AND gate, having a first input connected to an output of the comparator and a second input being connected to an output from the proximity switch indicative of the switch state, an output of the AND gate being connected to a gate of the thyristor for triggering the thyristor, wherein, the comparator and the AND gate are provided within the proximity switch integrated circuit.

2. A two wire AC power supply as claimed in claim 1, wherein a current limiting circuit is connected in parallel with a switch which is provided between the output of the voltage regulator and the anode of the diode, the current limiting circuit and the switch also being provided within the integrated circuit.

3. A two wire AC power supply as claimed in claim 1 or 2, wherein the integrated circuit is implemented in bipolar transistor technology.

4. A two wire AC power supply as claimed in claim 3, wherein the comparator comprises a PNP differential pair comprising first and second transistors (Q1, Q2) powered via a further current source (Q7, Q8), the first input of the comparator being connected to means for dividing down the input voltage (QD1, R1, R2, QD2), the divided down voltage being applied to the base of the first transistor (Q1), the second input being connected to further means for dividing down a regulated voltage and for providing hysteresis (R3, R4, R5, Q5, Q6), the regulated voltage being derived from the integrated circuit, the collectors of the differential pair (Q1, Q2) being connected to a differential to single-ended converter (Q3, Q4) an output from the comparator being developed at the collector of a third transistor (Q6), the collector of which is connected to a current source (Q9) and the base of which is connected to the further dividing down means.

5. A two wire AC power supply as claimed in claim 2, wherein the constant current circuit comprises fourth and fifth NPN transistors (QCC1, QCC2) connected in parallel and further connected between their collectors and bases in parallel with a resistor (R100UA), the emitters being connected to a parallel arrangement comprising a second resistor (R2500UA) connected in parallel between the base to emitter junction of a sixth NPN transistor (Q2500UA) which is connected in series with a third resistor (RTHUR1), the collector of the sixth transistor (Q2500UA) being connected to the bases of the fourth and fifth NPN transistors (QCC1, QCC2).

6. A two wire AC power supply as claimed in claim 2, wherein the switch connected in parallel with the constant current circuit comprises a fourth resistor (RSAT) connected to the collector of a seventh transistor (QDARL) having a fifth resistor (RODARL) connected between its base and emitter, the emitter of the seventh transistor (QDARL) being connected to the base of an eighth transistor (QSW), the eighth transistor (QSW) having a sixth resistor (RQSW) connected between its base and emitter, the emitter of the eighth transistor (QSW) further being connected to a parallel arrangement comprising a seventh resistor (R50MA) and the base to emitter junction of a ninth transistor (Q50MA) which is connected in series with an eighth resistor (RHUR2), the collector of the ninth transistor (Q50MA) further being connected to the base of the seventh transistor (QDARL).

7. A two wire AC power supply as claimed in claim 6, wherein the base current to the seventh transistor (QDARL) is provided by a current mirror (QM4, QM5, QM6, QMT, QM8), input current to the mirror being controlled by a signal derived from the proximity switch.

8. A two wire AC power supply for a proximity switch integrated circuit comprising:
   a bridge rectifier connected to an external AC power source;
   a voltage regulator, connected in parallel with the bridge rectifier;
   a thyristor, also connected in parallel with the bridge rectifier;
   a diode having its anode connected to an output of the regulator;
   a storage capacitor being connected between the cathode of the diode and an output of the bridge rectifier;
   a comparator, having one input connected to the other output of said regulator and another input being held at a constant reference voltage;
   an AND gate, having a first input connected to an output of the comparator and a second input being connected to an output from the proximity switch indicative of the switch state, an output of the AND gate being connected to a gate of the thyristor for triggering the thyristor;
   a current limiting circuit connected in parallel between the output of the voltage regulator and the anode of the diode; and
   a switch connected in parallel with the current limiting circuit for providing an alternate current path to the current limiting circuit in response to the output of the proximity switch indicating a switch closed state, the comparator, the AND gate, the current limiting circuit and the switch being provided within the integrated circuit.

* * * * *